United States Patent [19]

Bar-on et al.

[11] Patent Number: 4,531,237
[45] Date of Patent: Jul. 23, 1985

[54] ENERGY CONSERVATION CIRCUIT FOR STANDBY OPERATION

[76] Inventors: Yair Bar-on; Gavriel Horn, both of Elbit Computers Ltd., P.O. Box 5390, Haifa, Israel

[21] Appl. No.: 554,170

[22] Filed: Nov. 22, 1983

Related U.S. Application Data

[63] Continuation of Ser. No. 320,648, Nov. 12, 1981, abandoned, which is a continuation of Ser. No. 149,712, May 14, 1980, abandoned.

[51] Int. Cl.³ .................. H04B 1/16; H03K 3/295
[52] U.S. Cl. .................. 455/343; 331/108 D; 331/111
[58] Field of Search .............. 455/343, 227-229; 331/108 D, 111, 143

[56] References Cited

U.S. PATENT DOCUMENTS

| | | | |
|---|---|---|---|
| 2,912,574 | 11/1959 | Gensel | 455/343 |
| 2,991,429 | 7/1961 | Force | 331/111 |
| 3,122,652 | 2/1964 | Kobbe et al. | 331/111 |
| 3,289,103 | 11/1966 | Campman | 331/111 |
| 3,488,596 | 1/1970 | Webster et al. | 455/343 |
| 3,731,228 | 5/1973 | Kubo et al. | 331/111 |
| 3,769,593 | 10/1973 | Williams | 455/227 |
| 4,194,153 | 3/1980 | Masaki et al. | 455/343 |

FOREIGN PATENT DOCUMENTS

| | | | |
|---|---|---|---|
| 2426649 | 12/1975 | Fed. Rep. of Germany | 455/343 |
| 1525326 | 9/1978 | United Kingdom | 455/343 |

OTHER PUBLICATIONS

Simple Hex VCO's Constructed from CMOS Inverter and Schmitt Trigger, G. Buurma, Feb. 1976, Electronic Design vol. 24, No. 3, p. 74.

*Primary Examiner*—Marc E. Bookbinder

[57] ABSTRACT

An energy-saving arrangement for a signal receiver that responds to intermittent incoming signals. The receiver is turned on periodically for short intervals so as to provide a low duty cycle during the standby intervals when there are no incoming signals. If an incoming signal is sensed during one of its "on" intervals, it remains on during the duration of the signal.

5 Claims, 2 Drawing Figures

ENERGY CONSERVATION CIRCUIT FOR STANDBY OPERATION

This application is a continuation of application Ser. No. 320,648, filed Nov. 12, 1981, which is a continuation of application Ser. No. 149,712, filed May 14, 1980, both now abandoned.

BACKGROUND OF THE INVENTION

This invention relates to an energy-conserving circuit for a signal receiver that responds to signals having a relatively short duty cycle and which is in a standby condition between the occurrences of such signals. An example of such a device is a battery-operated radio receiver which is on continuously in order to receive and process intermittently transmitted incoming signals. Essentially the receiver is in active operation only during the occurrence of an incoming signal. At other times it is in a standby mode awaiting the occurrences of the signals. The present invention is directed to the reduction of energy consumption by such devices and this is particularly important in situations where they are remotely located and depend on power from batteries or other energy storage units whose energy must be replenished from time to time. Each instance of energy replenishment can be an occasion of substantial cost.

SUMMARY OF THE INVENTION

It is a principal object of the invention to provide a signal reception system characterized by relatively low energy consumption.

A more specific object of the invention is to provide a signal reception system that is powered from a source having a limited supply of energy and which is characterized by relatively low energy consumption so as to decrease the cost of replenishing the energy source.

The invention makes use of the fact that signal receivers often dwell substantial periods of time in a standby operation during which they operate at essentially high power while awaiting the occurences of incoming signals. A novel standby control circuit repeatedly turns the receiver on and off, the "on" intervals being substantially shorter than the "off" intervals. If, during one of the "on" intervals, there is an occurence of an incoming signal, the receiver stays on until the signal terminates. During the "off" intervals the power is disconnected from the receiver, so that the only power consumed is the very small amount used by the standby control circuit. This will often be negligible compared with the power consumed by the receiver and the total energy consumed during standby operation is therefore drastically reduced by the invention.

As an example, if the incoming signals have an overall duty cycle of 10% and the standby control circuit provides a total "on" time or duty cycle of less than 1% during the standby periods, the energy consumption of the receiver will be reduced by almost 90%. The amount of energy saved by the invention depends, of course, on the overall duty cycle of the incoming signals, specifically, the lower the duty, the greater the saving.

One will thus readily appreciate the advantage of the invention in numerous applications involving battery-operated signal receivers. Specifically, it will greatly reduce the frequency of battery replacement or recharging; indeed, in many applications it will permit the use of batteries that are continuously recharged by low-power generators such as alpha- or beta-particle devices. Moreover, the invention is equally applicable to non-electrical signal detectors, such as pneumatic and hydraulic devices, which are powered from limited sources of energy. Nor, in electrical systems, is it limited to receivers for signals modulated on carriers. It is equally applicable to receivers whose incoming signals are in such different forms as audio waveforms, digital pulse streams and non-electrical condition indications. Among the latter, for example, are such devices as battery-operated temperature limit sensors and smoke detectors.

DETAILED DESCRIPTION OF THE INVENTION

Figure 1:
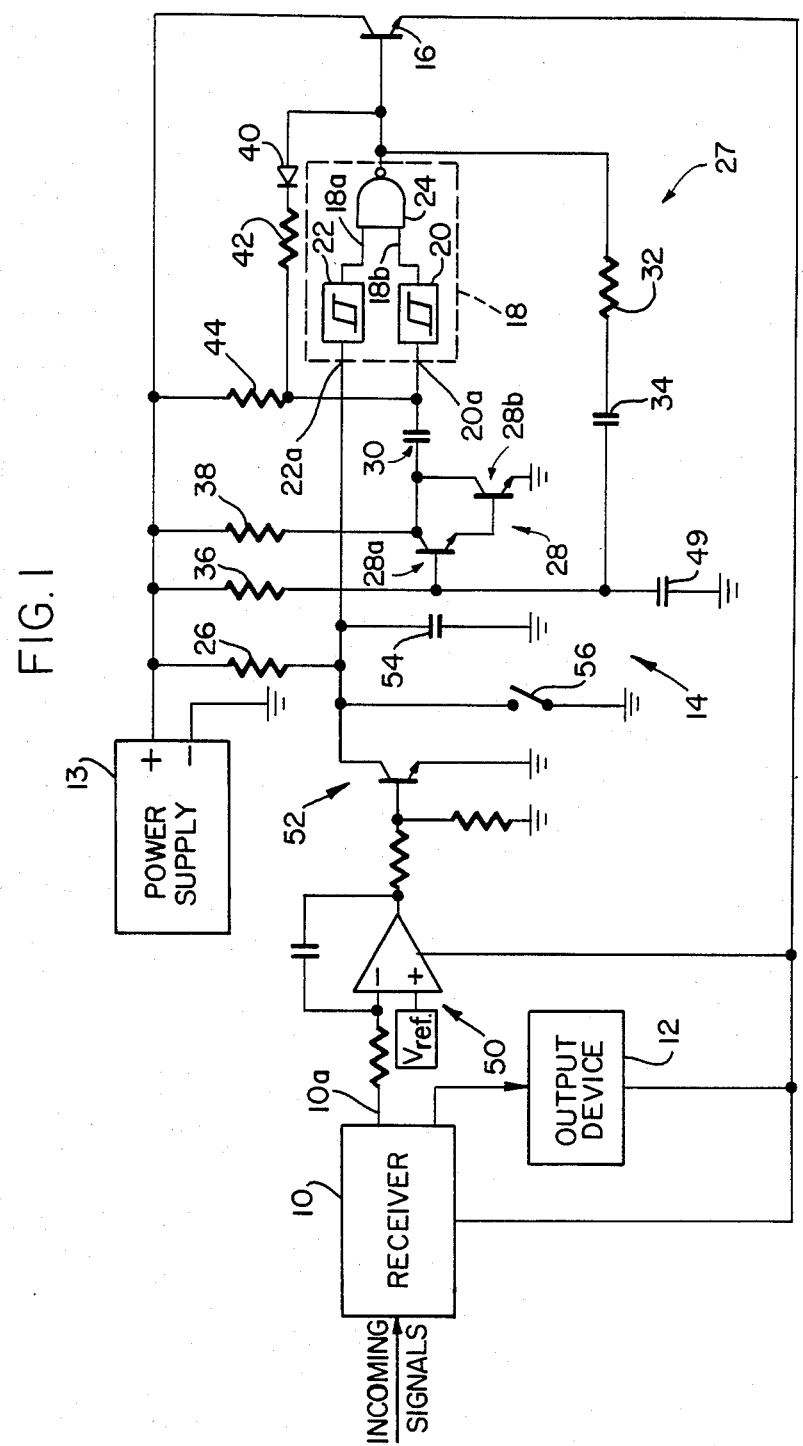
FIG. 1 is a schematic diagram of a system embodying the energy conserving techniques of the present invention.

FIG. 1 illustrates an embodiment of the invention in which a receiver 10 receives and processes incoming signals and applies corresponding output signals to an output device 12. The receiver 10, for example, may be a conventional communications receiver used for voice communications, in which case the output device 12 may be a loudspeaker. As another example the receiver 10 may be part of a signal repeating unit, in which case the output device 12 will be a transmitter for retransmitting the incoming signals. The transmitter will be switched on by a command from the receiver only when transmission is required. Since the incoming signals occur essentially randomly, the receiver 10 must be operated in an essentially continuous signal-detecting mode so as not to miss any of the incoming signals. Prior to the present invention this has meant that the receiver must operate continuously, i.e., with its signal-detection circuitry always in operation. The present invention greatly reduces the energy consumption of the receiver 10 during the standby periods between the occurrences of the incoming signals.

More specifically, the illustrated system includes a standby control circuit 14 that controls the power supplied to the receiver 10, and the output device 12 if required, from a power supply 13. The control circuit 14 includes a transistor 16 that functions as a switch between the supply 13 and the receiver 10. The circuit 14 turns on this switch intermittently during the standby periods for short signal-sensing intervals. If an incoming signal is sensed by the receiver during one of these intervals, the circuit 14 maintains the transistor 16 in a conducting or "on" condition for the duration of the signal.

Conduction by the switch transistor 16 is controlled by a gate circuit 18 which is an integrated circuit functioning as a pair of Schmitt triggers 20 and 22 whose outputs are the inputs of a NAND gate 24, the output of the NAND gate 24 also being the output of the gate circuit 18. Each of the Schmitt triggers 20 and 22 has an assertion level (positive voltage) output when its input voltage increases have an upper threshold level and, conversely, each of the triggers provides a negation (zero volt) output in response to a decrease of its input voltage below a lower threshold level. Thus, if both of the input voltages of the gate circuit 18 exceed the upper threshold level, both of the triggers 20 and 22 will have assertion level outputs, with a resulting zero-volt output from the NAND gate 24. If the input voltage of either of the Schmitt triggers decreases below the lower threshold level, so that one of the NAND gate inputs is not at the assertion level, the output of the NAND gate 24 will be a positive voltage. This will cause conduction by the transistor 16, thereby applying power to the receiver 10 from the supply 13.

The gate circuit 18 is available from a number of sources, an illustrative unit being type CD4093B marketed by RCA Corporation. A CD4093B unit contains four gate circuits of which only one is used for the gate circuit 18.

During standby operation, the input voltage of the Schmitt trigger 22 is maintained above the upper threshold level by means of a resistor 26 connected between the power supply 13 and the input terminal 22a. The trigger 22 thus has an assertion level output and the output of the NAND gate 24 then depends on the output level of the Schmitt trigger 20. This latter signal alternates between the assertion and negation levels, thereby causing the transistor 16 to conduct periodically, with corresponding operation of the receiver 10.

The Schmitt trigger 20 is part of an oscillator 27 comprising a Darlington amplifier 28 whose output is coupled to the Schmitt input trigger terminal 20a by a capacitor 30. The output of the gate circuit 18 is fed back to the amplifier 28 by way of a resistor 32 and capacitor 34. The amplifier 28 includes transistors 28a and 28b, the capacitor 34 being connected to the base of the transistor 28a. A resistor 36 is connected between the transistor base and the power supply 13. Collector voltage for the amplifier 28 is provided by a resistor 38.

A second feedback path is provided by a diode 40 and resistor 42 connected in series between the output terminal of the gate circuit 18 and the input terminal 20a of the Schmitt trigger 20. Bias voltage for the terminal 20a is provided by a resistor 44 connected to the power supply 13.

The oscillator 27 operates as follows. Assume that initially the voltage throughout the oscillator is zero. When power is first turned on, the resistor 44 will apply sufficient voltage to the terminal 20a to provide an assertion level at the output of the Schmitt trigger 20 and this combined with the assertion level output of the trigger 22, noted above, will provide a zero output voltage from the gate circuit 18. The transistor 16 will thus be in the nonconducting state.

Current through the resistor 36 will ultimately charge up the capacitor 34 to a voltage, approximately 1.2 volts, at which base-emitter current flows in the transistors 28a and 28b. Resulting collector conduction in these transistors reduces the collector voltage, this voltage reduction being coupled by the capacitor 30 to the input terminal 20a of the gate circuit 18, thereby reducing the voltage at that terminal below the lower threshold voltage of the Schmitt trigger 20. The resulting drop in the output voltage of the Schmitt trigger 20 causes the output of the NAND gate 24 to rise to the positive or assertion level, thereby turning on the transistor 16 to apply power to the receiver 10.

The positive output voltage of the gate circuit 18 is fed back to the input terminal 20a by the diode 40 and resistor 42. This increases the voltage at that terminal above the upper threshold level of the Schmitt trigger 20. The time required for the increase is governed by the rate of charging of the capacitor 30 through the resistor 42, the resistor 44 having a much greater resistance than the resistor 42 and therefore having a negligible affect on this charging operation.

The positive-going step in the gate circuit output voltage is also passed through the resistor 32 and capacitor 34 to the base of the transistor 28a, but the base voltage does not rise correspondingly, since it is limited by forward base-emitter conduction in the transistors 28a and 28b. The resistor 32 limits the current coupled through the capacitor 34, thereby preventing excessive loading of the gate circuit 18 and maintaining the output voltage of the gate circuit at a sufficiently high level for a rapid increase of voltage at the terminal 20a.

When the voltage at the terminal 20a exceeds the upper threshold level of the Schmitt trigger 20, the corresponding assertion level of the output of the trigger 20 causes a sudden decrease in the output voltage of NAND circuit 24, thereby turning off the transistor 16 and interrupting power to the receiver 10. With the output of the gate circuit 18 now at its non-asserted or zero-volt level, conduction through the diode 40 ceases and the voltage at the Schmitt trigger input terminal 20a essentially stops increasing.

The negative-going step in the gate circuit output voltage is passed by the capacitor 34 to the base of the transistor 28a, where it reduces the voltage to a negative level. This terminates collector conduction by the transistors 28a and 28b, with a corresponding increase in collector voltages to that of the power supply 13. This positive-going voltage change at the transistor collectors is passed by the capacitor 30 to further increase the voltage level at the terminal 20a.

The voltage at the terminal 20a then begins to slowly decrease by virtue of conduction through the resistor 44. At the same time conduction through the resistor 36 gradually recharges the capacitor 34 until the voltage at the base of the transistor 28a reaches the small positive value required for conduction by the transistors 28a and 28b. When that occurs, the collectors of these transistors again conduct, thereby dropping the collector voltage of the amplifier 28. The capacitor 30 couples a corresponding decrease in voltage to the Schmitt trigger terminal 20a, thereby reducing the potential at that terminal below the lower threshold level of the Schmitt trigger 20. The resulting positive output voltage from the gate circuit 18 then turns on the transistor 16 to provide another short interval of operation by the receiver 10.

In this manner the oscillator 27 continues to cycle, providing a series of relatively short pulses that provide short "on" intervals for the receiver 10 interspersed with relatively long "off" intervals. The duration of each "on" interval is governed by the time it takes to recharge the capacitor 30 to a voltage above the upper threshold level of the Schmitt trigger 20. This time, in turn, depends on the time constant of the charging circuit and in particular, the capacitance of the capacitor 30 and the resistance of the resistor 42. The duration of the "off" interval during each oscillator cycle is the time required for the capacitor 34 to charge to the voltage required for base-emitter conduction in the transistors 28a and 28b. This time is governed essentially by the capacitance of the capacitor 34 and the resistance of the resistor 36, through which the capacitor is recharged.

By way of example, an oscillator of the type depicted may have the following circuit parameters for a cycle time of about one second in which the "on" interval of the receiver 10 is about one millisecond; i.e., a duty cycle of 0.1% for the receiver:
R32—12 kilohms
R36—12 megohms
R38—470 kilohms
R42—68 kilohms
R44—4.7 megohms
C30—22 nanofarads
C34—0.22 microfarads Preferably the circuit also includes a capacitor 49 connected between the base of the transistor 28a and ground. This capacitor, which helps to suppress parasitic oscillations, has a small capacitance, e.g., 680 picofarads.

If, during any of the on intervals of the receiver 10 there is an incoming signal, the receiver will provide a corresponding negative output voltage change at a terminal 10a. Specifically, the terminal 10a is connected to a point in the receiver at which there is a negative DC voltage change that indicates the detection of an incoming signal. The point at which this detection signal is present may be in a detector or automatic gain control circuit. If there is no such circuit in the receiver, the requisite voltage can be derived by rectifying the output signal from the receiver. In either case the detection signal is passed through a low-pass filter 50 whose output, in turn, is applied to the base of a transistor 52. The collector of the transistor 52 is connected to the input terminal 22a of the gate circuit 22. Thus, the presence of a detection signal at the receiver terminal 10a causes the transistor 52 to conduct. This effectively grounds the gate circuit terminal 22a, with a resulting low level voltage from the Schmitt trigger 22 and a corresponding high level output from the NAND gate 24. The latter output forces conduction by the transistor 16 and thereby maintains the receiver 10 in the "on" condition so long as the incoming signal persists.

When the incoming signal terminates, the voltage level at the terminal 10a decreases in magnitude, as does the output voltage of the low-pass filter 50, thereby turning off the transistor 52 and allowing the terminal 22a to return to a positive voltage exceeding the upper threshold level of the Schmitt trigger 22. The standby control circuit then returns to the standby mode in which the oscillator 27 periodically turns on the receiver for short intervals to sense the next occurence of an incoming signal.

A capacitor 54, connected between the gate circuit terminal 22a and ground delays the increase in the voltage at that terminal when the transistor 52 is turned off. This maintains the receiver 10 in the "on" condition when there are brief interruptions in the detection signal at the receiver terminal 10a due, for example, to noise or an excessive modulation factor.

The low-pass filter 50 is a differential amplifier whose non-inverting input terminal is connected to source supplying a positive reference voltage. Inputs from the receiver terminal 10a must have a magnitude greater than the reference voltage to provide an output from the filter 50 and this provides a further degree of immunity to noise in the input from the receiver 10.

The system also includes a manual override arrangement which permits the operator to turn on the receiver at will. It comprises a switch 56 which, when closed, grounds the gate circuit input terminal 22a and thereby forces a positive output voltage from the gate circuit to turn on the transistor 16 and thereby apply power to the receiver 10.

The oscillator 27 should ordinarily be arranged to provide an "on" time that is as short as possible but long enough to enable the receiver 10 to provide the required signal at the terminal 10a in response to an incoming signal. The "off" time should be as long as possible without interfering with the operational requirements of the system in which the receiver 10 is incorporated.

If the incoming signal has a duty cycle that is greater than the standby duty cycle provided by the oscillator 27, the power consumption of the receiver 10 will be reduced to a percentage corresponding to the duty cycle of the signal. For example, with a signal duty cycle of 10% and a standby duty cycle of less than 2%, the power consumption with the energy-conserving circuit will be about 10% of the consumption without the circuit, a reduction of about 90%.

If the signal duty cycle is less than the standby duty cycle, the power consumption of the receiver will be reduced to a percentage corresponding to the standby duty cycle. For example, if the incoming signal has a total duration of 1.5 minutes in a 24-hour interval, a duty cycle of 0.1%, and the standbay duty cycle is 0.5%, the power consumption with the circuit will be 0.5% of the consumption without the circuit.

As a final example, if the signal duty cycle is 0.1% and the standby duty cycle provided by the oscillator is also 0.1%, such as obtained with the specific circuit described above, the power consumption will be 0.2% of the consumption without the energy-conserving circuit, for a reduction of 99.8%.

It will be apparent that other circuits can be used to provide the same function as the illustrated standby control circuit. For example, there are a number of oscillator circuits that can generate periodic pulses that provide the preferably short duty cycle of the receiver 10 during standby operation. Further, the output of any of these oscillators can be logically combined with a signal detection output from the receiver 10 to maintain power to the receiver for the duration of incoming signals. However, the illustrated circuit is preferred because of its low power consumption for the standby control function. It draws a current of 2 microamperes, which is negligible in comparison with the current drawn by most receivers.

Figure 2:
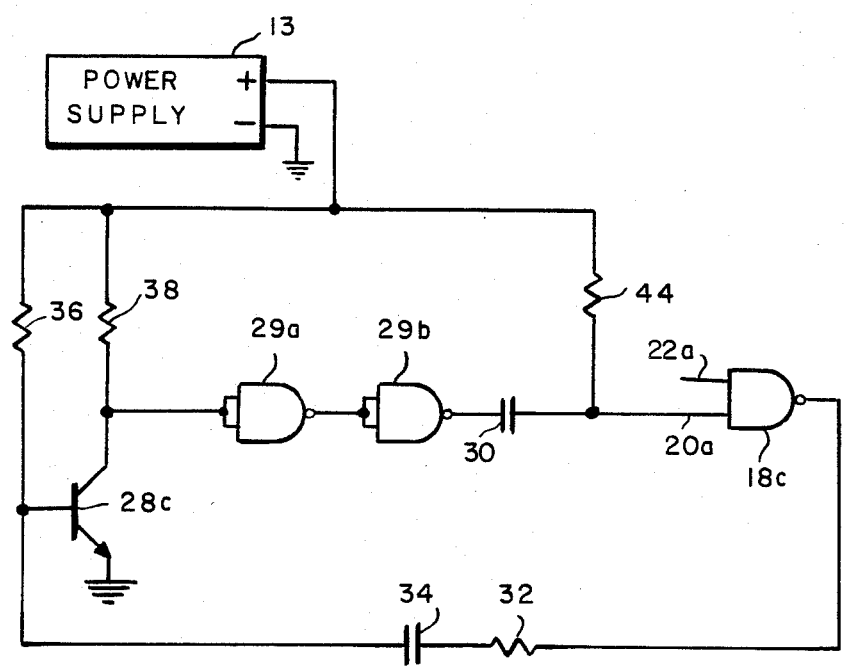
FIG. 2 is a schematic diagram of an alternative embodiment of the oscillator 27 of FIG. 1.

The low power consumption is provided by the use of CMOS integrated Circuit together with feedback that facilitates fast transitions between the two states of the oscillator 27. To provide this function one may also use a modified circuit with a pair of cascaded inverters connected between the amplifier 28 and the capacitor 30. This modified circuit is shown in FIG. 2 with NAND gates 29a and 29b connected as cascaded inverters. The diode 40 and resistor 42 would then be eliminated and the resistor 44 would have the value of resistor 42. The added inverters will amplify changes of the output voltage of the amplifier 28 to thereby provide the desired abrupt changes in the voltage at the terminal 20a. Because of the added voltage gain of the two inverters, the Darlington amplifier 28 may be replaced by a single transistor 28c. Also, the gate circuit 18 may be a simple NAND gate, 18c so that the oscillator 27 may be constructed by using one transistor and one integrated circuit such as the type CD4011B marketed by RCA Corporation.

The low power consuption of the oscillator makes it useful also in non-signal-sensing applications where intermittent operation is desired, for example, battery-operated flashers.

Accordingly, while the foregoing description is limited to a specific embodiment of this invention, it will be apparent that numerous modifications can be made without departing from the scope of the invention. Therefore, it is the object of the appended claims to cover all such variations and modifications.

What we claim as new and desire to secure by Letters and Patent of the United States is:

1. An oscillator powered by a power supply comprising
A. a logic circuit comprising the cascaded combination of a Schmitt trigger and an inverter and having an input terminal and an output terminal,
B. a transistor amplifier having an input terminal and an output terminal,
C. a first capacitor connected between said output terminal of said amplifier and said input terminal of said logic circuit,
D. a second capacitor connected between the output terminal of the logic circuit and the input terminal of the amplifier,
E. first impedance means connected between said power supply and said input terminal of said amplifier and,
F. unidirectional second impedance means connected between the output terminal of said logic circuit and input terminal of said logic circuit, whereby:
  i. the output of said logic circuit switches between a first level and a second level, and
  ii. when said logic circuit output switches to the first level, a corresponding voltage change passed by said second capacitor terminates conduction by said amplifier, and
  iii. conduction by said first impedance means then changes the voltage on said second capacitor to initiate conduction by said amplifier,
  iv. initiation of amplifier conduction causing said first capacitor to apply a voltage change at said logic circuit input terminal, resulting in said second level of said logic circuit output,
  v. said second impedance means conducting during the occurence of said second level to apply a voltage change at said logic circuit input terminal, resulting in said first level of said logic circuit output.

2. A signal receiving system comprising:
A. a receiver for detecting incoming signals
B. a power supply for powering said receiver, and
C. a standby control unit connected to periodically make a connection between said power supply and said receiver to enable detection of an incoming signal by said receiver, said standby control unit including
  (1) switch means for applying power from said power supply to said receiver in response to a switch signal;
  (2) an oscillator providing periodic pulses having a relatively low duty cycle, said oscillator comprising:
    a. a logic circuit comprising the cascaded combination of a Schmitt trigger and an inverter and having an input terminal and an output terminal,
    b. a transistor amplifier having an input terminal and an output terminal,
    c. a first capacitor connected between said output terminal of said amplifier and said input terminal of said logic circuit,
    d. a second capacitor connected between the output terminal of the logic circuit and the input terminal of the amplifier,
    e. first impedance means connected between said power supply and said input terminal of said amplifier and,
    f. unidirectional second impedance means connected between the output terminal of said logic circuit and input terminal of said logic circuit, whereby:
      i. the output of said logic circuit switches between a first level and a second level, and
      ii. when said logic circuit output switches to a first level, a corresponding voltage change passed by said second capacitor terminates conduction by said amplifier, and
      iii. conduction by said first impedance means then changes the voltage on said second capacitor to initiate conduction by said amplifier,
      iv. initiation of amplifier conduction causing said first capacitor to apply a voltage change at said logic circuit input terminal, resulting in said second level of said logic circuit output,
      v. said second impedance means conducting during the occurence of said second level to apply a voltage change at said logic circuit input terminal, resulting in said first level of said logic circuit output,
  (3) means for providing a detection signal in response to the detection of an incoming signal by said receiver, and
  (4) coincidence means for providing said switch signal in response to a pulse from said oscillator or said detection signal.

3. An oscillator powered by a power supply, said oscillator comprising
A. a logic circuit comprising the cascaded combination of a Schmitt trigger and an inverter, and having an input terminal and an output terminal,
B. a transistor amplifier having an input terminal and an output terminal,
C. a first capacitor connected between said output terminal of said amplifier and said input terminal of said logic circuit,
D. a second capacitor connected between the output terminal of the logic circuit and the input terminal of the amplifier,
E. first impedance means connected between said power supply and said input terminal of said amplifier, and
F. second impedance means connected between said power supply and said input terminal of said logic circuit, whereby:
  i. the output of said logic circuit switches between a first level and a second level, and
  ii. when said logic circuit output switches to the first level, a corresponding voltage change passed by said second capacitor terminates conduction by said amplifier, and
  iii. conduction by said first impedance means then changes the voltage on said second capacitor to initiate conduction by said amplifier,
  iv. initiation of amplifier conduction causing said first capacitor to apply a voltage change at said logic circuit input terminal, resulting in said second level of said logic circuit output, v. conduction by said second impedance means then changing the voltage on said first capacitor and at the input terminal of said logic circuit, resulting in said first level of said logic circuit output.

4. An oscillator powered by a power supply, said oscillator comprising

A. a logic circuit comprising an inverter, and having an input terminal and an output terminal,
B. a transistor amplifier having an input terminal and an output terminal,
C. a second amplifier having an input terminal and an output terminal,
D. means coupling said input terminal of said second amplifier with said output terminal of said transistor amplifier,
E. a first capacitor connected between said output terminal of said second amplifier and said input terminal of said logic circuit,
F. a second capacitor connected between the output terminal of the logic circuit and the input terminal of the transistor amplifier,
G. first impedance means connected between said power supply and said input terminal of said transistor amplifier, and
H. second impedance means connected between said power supply and said input terminal of said logic circuit, whereby:
  i. the output of said logic circuit switches between a first level and a second level, and
  ii. when said logic circuit output switches to a first level, a corresponding voltage change passed by said second capacitor terminates conduction by said transistor amplifier, and
  iii. conduction by said first impedance means then changes the voltage on said second capacitor to initiate conduction by said transistor amplifier,
  iv. initiation of transistor amplifier conduction causing said second amplifier to cause said first capacitor to apply a voltage change at said logic circuit input terminal, resulting in said second level of said logic circuit output,
  v. conduction by said second impedance means then changing the voltage on said first capacitor and at the input terminal of said logic circuit, resulting in said first level of said logic circuit output.

5. An oscillator as claimed in claim 11 wherein the second amplifier comprises the cascaded combination of two inverters.

* * * * *